US006294828B1

(12) United States Patent
LaFontaine, Jr. et al.

(10) Patent No.: US 6,294,828 B1
(45) Date of Patent: Sep. 25, 2001

(54) SEMICONDUCTOR CHIP PACKAGE (75) Inventors: William Rena LaFontaine, Jr., Vestal; Paul Allen Mescher, Binghamton; Charles Gerard Woychik, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/521,353

(22) Filed: Mar. 9, 2000

Related U.S. Application Data (62) Division of application No. 08/469,990, filed on Jun. 6, 1995, now Pat. No. 6,130,476, which is a division of application No. 08/189,530, filed on Jan. 31, 1994, now abandoned.

(51) Int. Cl.7 .......................... H01L 23/48; H01L 29/40; H01L 31/0288; H01L 29/12; H01L 29/20
(52) U.S. Cl. ......................... 257/678; 257/106; 257/734; 257/738; 257/108; 257/772; 257/779; 257/762; 257/612; 257/613; 257/615
(58) Field of Search ................................ 257/678, 738, 257/781, 772, 779, 762; 438/106, 734, 108, 612, 613, 615

(56) References Cited

U.S. PATENT DOCUMENTS

| 3,595,564 | 7/1971 | De Young | 271/46 |
| 3,680,418 | 8/1972 | Phillips | 83/80 |
| 3,703,116 | 11/1972 | Doll | 83/17 |
| 3,728,921 | 4/1973 | Vogel | 83/151 |
| 3,748,939 | 7/1973 | Feinstein et al. | 83/370 |
| 3,888,066 | 6/1975 | Tabur | 53/167 |
| 3,965,785 | 6/1976 | Johns | 83/316 |
| 4,207,667 | 6/1980 | D'Angelo et al. | 29/417 |
| 4,772,353 | 9/1988 | Weiss et al. | 156/522 |
| 4,919,351 | 4/1990 | McNeil | 242/56 |
| 4,967,950 | * 11/1990 | Legg | 228/180.2 |
| 5,074,178 | 12/1991 | Shetley et al. | 83/47 |
| 5,103,703 | 4/1992 | Littleton | 83/155 |
| 5,162,071 | 11/1992 | Nagafuchi et al. | 156/360 |
| 5,176,784 | 1/1993 | Nagafuchi et al. | 156/510 |
| 5,188,699 | 2/1993 | Senda | 156/521 |
| 5,372,670 | 12/1994 | Cummings et al. | 156/390 |
| 5,425,834 | 6/1995 | Shinohara et al. | 156/360 |
| 5,456,789 | 10/1995 | Boucher | 156/354 |

FOREIGN PATENT DOCUMENTS

0256141 * 12/1989 (JP) .

OTHER PUBLICATIONS

Puttlitz, 1990 IEEE, ". . Pb–Sn and Pb–In terminated Flip Chips Attached to Gold . . . ", 360–367.*
IBM Technical Disclosure, vol. 14 Issue 11, "Metalurgy Barrier for Au and Pb", 3358.*
Mizuishi, 1988 IEEE,"Thermal Stability of Various Ball Limited Metal", 67–70.*

* cited by examiner

Primary Examiner—Stephen D. Meier
Assistant Examiner—James Mitchell
(74) Attorney, Agent, or Firm—Lawrence R. Fraley

(57) ABSTRACT

A method for joining a semiconductor integrated circuit chip in a flip chip configuration, via solder balls, to solderable metal contact pads, leads or circuit lines on the circuitized surface of an organic chip carrier substrate, as well as the resulting chip package, are disclosed. The inventive method does not require the use of a solder mask, does not require the melting of the bulk of any of the solder balls and does not require the use of a fluxing agent.

8 Claims, 4 Drawing Sheets

SEMICONDUCTOR CHIP PACKAGE

This application is a divisional application of Ser. No. 08/469,990, filed Jun. 6, 1995 now U.S. Pat. No. 6,130,476, which in turn is a divisional application of Ser. No. 08/189,530, filed Jan. 31, 1994 and now abandoned.

In addition, another co-pending application, Ser. No. 09/731,341, was filed Dec. 6, 2000, and claims a method of fabricating a semiconductor chip package. Ser. No. 09/731,341 is a continuation of application Ser. No. 08/433,625, filed May, 03, 1995 and now U.S. Pat. No. 6,162,660, which is in turn also a divisional application of Ser. No. 08/189,530, now abandoned.

BACKGROUND OF THE INVENTION

1. Field of the Invention

The invention involves a method for joining a semiconductor integrated circuit chip to a chip carrier substrate and the resulting chip package.

2. Description of the Related Art

In one class of chip packages, one or more semiconductor integrated circuit chips are mounted face down, in the so-called flip chip configuration, onto solderable metal pads on the circuitized surface of a chip carrier substrate, e.g., ceramic substrate, via solder balls. Such mounting is achieved by applying solder balls, having a composition which includes, for example, 97 percent (by weight) Pb and 3 percent (by weight) Sn, to contact pads on the circuit-bearing surface of each semiconductor chip. In addition, a solder mask is formed on the circuitized surface of the chip carrier substrate to prevent solder from flowing beyond the boundaries of the solderable metal contact pads on this circuitized surface. Then, the solder balls on the chip contact pads are brought into contact with the solderable metal contact pads on the substrate circuitized surface, and a fluxing agent, often including chloro-fluoro-carbons (CFCs), is applied to the solder balls in order to eliminate oxide layers which may have formed on the surfaces of the solder balls and/or solderable metal contact pads. Finally, the solder balls are heated to a sufficiently high temperature, e.g., 330 degrees C, so that they melt and undergo reflow. Upon cooling and re-solidification, the solder balls form firmly adherent, mechanical and electrical connections between the contact pads on each chip and the solderable metal contact pads on the chip carrier substrate.

If the chip carrier substrate is, for example, a ceramic substrate, such as an alumina substrate, then the above-described chip joining process is definitely effective and results in a useful and commercially valuable chip package. That is, neither the presence of the solder mask, nor the reflow process, during the chip joining process is at all adverse to the final chip package. Of course, the use of fluxing agents containing CFCs is considered environmentally undesirable, and attempts are now being made to replace such fluxing agents with fluxing agents which do not contain CFCs.

Significantly, a new type of chip package is now being developed which includes one or more semiconductor chips mounted in the flip chip configuration on an organic chip carrier substrate, such as a polyimide chip carrier substrate. Because such a polyimide substrate is often processed while in a tape- or roll-like form, and because the bonding of a chip or chips to such a polyimide substrate is typically achieved via an automated bonding process, such an organic substrate is often referred to as a TAB (tape automated bonding) substrate or TAB-like substrate. Here, the one or more semiconductor chips are mounted face down, via solder balls, onto solderable metal contact pads or leads or circuit lines (hereinafter generically referred to as solderable metal contact pads) on the circuitized surface of the organic chip carrier substrate.

Unfortunately, the chip joining process used in connection with ceramic chip carrier substrates is disadvantageous when used in connection with organic chip carrier substrates, such as polyimide chip carrier substrates. That is, one of the advantages of, for example, polyimide substrates is that they are highly flexible, which makes them more useful than the relatively rigid ceramic substrates for a variety of applications. However, the presence of a solder mask on a polyimide substrate substantially reduces the flexibility of the substrate, which is obviously undesirable. In addition, the relatively high temperatures needed to melt and reflow solder balls distorts polyimide substrates and thereby substantially degrades the dimensional stability of such substrates, which makes subsequent processing of such substrates very difficult, if not impossible. Moreover, these reflow temperatures are so high that polyimide substrates are often on the verge-of decomposing, while other chip carrier substrates, such as epoxy/glass chip carrier substrates, do decompose at these temperatures.

Thus, those engaged in the development of chip packages which include organic chip carrier substrates have sought, thus far with relatively little success, methods for joining chips to organic chip carrier substrates which do not require the use of solder masks, which do not require the melting of solder balls and which do not require the use of fluxing agents.

SUMMARY OF THE INVENTION

The invention involves a method for joining a semiconductor chip in a flip chip configuration, via solder balls, to solderable metal contact pads (i.e., solderable metal contact pads, leads or circuit lines) on the circuitized surface of an organic chip carrier substrate, which method does not require the use of a solder mask, does not require the melting of the bulk of any of the solder balls and does not require the use of a fluxing agent. The invention also involves the, resulting chip package.

Significantly, in accordance with the inventive method, the composition of each of the solder balls, which includes at least a first component, and the composition of the upper portion of each of the solderable metal contact pads on the organic chip carrier substrate, which includes at least a second component, are chosen in relation to each other so as to satisfy a specific requirement. That is, the at least first and second components are chosen in relation to each other so that when brought into proximity with one another and heated, they react to form a relatively low melting point composition (hereinafter denominated RLMPC), such as a eutectic composition, which includes the first and second components. Moreover, the first and second components are chosen so that the RLMPC has a melting temperature which is lower than the melting temperatures of the solder balls and of the contact pads on the organic chip carrier substrate. Consequently, when the solder balls are brought into contact with the contact pads, subjected to sufficient pressure to break any oxide layers covering the solder balls and/or the contact pads, and heated to the melting temperature of the RLMPC associated with the first and second components, a corresponding liquid melt forms at and/or adjacent to the interface between each solder ball (the bulk of which remains unmelted) and the corresponding contact pad (the bulk of which also remains unmelted) on the organic chip carrier substrate. It must be noted that only the relatively thin upper portion of each contact pad is chosen to have a composition which participates in the reaction leading to the formation of the RLMPC. By contrast, the remainder of the contact pad has a different composition which does not participate in the reaction, to preclude dissolution of the bulk of the contact pad, and does not melt at the melting temperature of the RLMPC. Moreover, because the melting temperature of the RLMPC is lower, and typically much lower, than the temperature needed to melt the solder balls, it follows that the organic chip carrier substrate suffers neither deformation nor decomposition. Upon cooling to room temperature, the solidified liquid RLMPC forms a solid bond between each solder ball and the corresponding contact pad. This bond is more than adequate for most purposes, provided the resulting chip package is not subjected to temperatures equal to or greater than the melting temperature of the RLMPC. (However, it must be noted that a solidified RLMPC does tend to dissociate very slowly, at room temperature, over a period of months or years. Therefore, a bond based upon a solidified RLMPC, while adequate for a period of months or years, may not be adequate for longer periods of time.)

In the event the above-described chip package must be subjected to processing temperatures which equal or exceed the melting temperature of the interfacial RLMPC, then either after solidification, or while still liquid, the interfacial RLMPC is subjected to further heating at a temperature or temperatures below the melting temperature of the solder balls and of the contact pads. Preferably, this further heating takes place at a temperature which is even below the melting temperature of the RLMPC. The purpose of this heating is to dissociate the RLMPC over a relatively short period of time, e. g., a few hours, and to disperse the second component (derived from the upper portion of the contact pad) of the RLMPC into and within each solder ball via solid state diffusion. (The term solid state diffusion means that the second component of the interfacial RLMPC is diffused into and within a solid, rather than a liquid, solder ball. As a consequence, the second component will be non-uniformly dispersed within the solder ball.) Such dispersion may result in the second component chemically combining with one of the compositional components of the solder ball. In any event, once the interfacial RLMPC is completely dissociated and the second component (non-uniformly) dispersed within each solder ball, upon cooling to room temperature the resulting solder ball is firmly adhered to the corresponding contact pad. Moreover, because each solder ball is usually much larger than the upper portion of the corresponding contact pad, it follows that the above process only slightly modifies the composition of each solder ball. Therefore, the melting temperature of each solder ball is almost unchanged. Consequently, the resulting chip package can readily be processed at temperatures significantly higher than the melting temperature of the interfacial RLMPC.

Throughout the above discussion, it has been assumed that the organic chip carrier substrate is, for example, a TAB substrate which, itself, is ultimately to be mounted onto a printed circuit card or printed circuit board. However, printed circuit cards and printed circuit boards are themselves fabricated from organic materials, such as epoxy/glass composites, and therefore the inventive method is useful for mounting semiconductor chips directly onto printed circuit cards or printed circuit boards. Therefore, in what follows, the term organic chip carrier substrate should be interpreted to denote organic chip carrier substrates such as, for example, TAB substrates, as well as printed circuit cards and printed circuit boards.

BRIEF DESCRIPTION OF THE DRAWINGS

The invention is described with reference to the accompanying drawings, wherein.

DETAILED DESCRIPTION OF THE PREFERRED EMBODIMENT(S)

The invention involves a method for joining a semiconductor chip in a flip chip configuration, via solder balls, to solderable metal contact pads (i.e., solderable metal contact pads, leads or circuit lines) on the circuitized surface of an organic chip carrier substrate without the use of a solder mask and without melting the bulk of each solder ball, as well as the resulting chip package.

As noted above, in accordance with the inventive method, the composition of each solder ball, which includes at least a first component, and the composition of the upper portion of each carrier contact pad, which includes at least a second component, are chosen in relation to each other so as to satisfy a specific requirement. That is, the at least first and second components are chosen in relation to each other so that when brought into proximity with one another and heated, they undergo a reaction resulting in the formation of an RLMPC, such as a eutectic composition, at and/or adjacent to the interface between each solder ball and the corresponding contact pad. Significantly, the first and second components are also chosen so that this interfacial RLMPC, which includes the first and second components, has a melting temperature which is lower than that of either the solder balls or the contact pads. As also noted above, only the relatively thin upper portion of each contact pad is chosen to have a composition which participates in the reaction resulting in the formation of the interfacial RLMPC. By contrast, the remainder of the contact pad has a different composition which does not participate in this reaction, to preclude dissolution of the contact pad, and does not melt at the melting temperature of the RLMPC.

Figure 1:
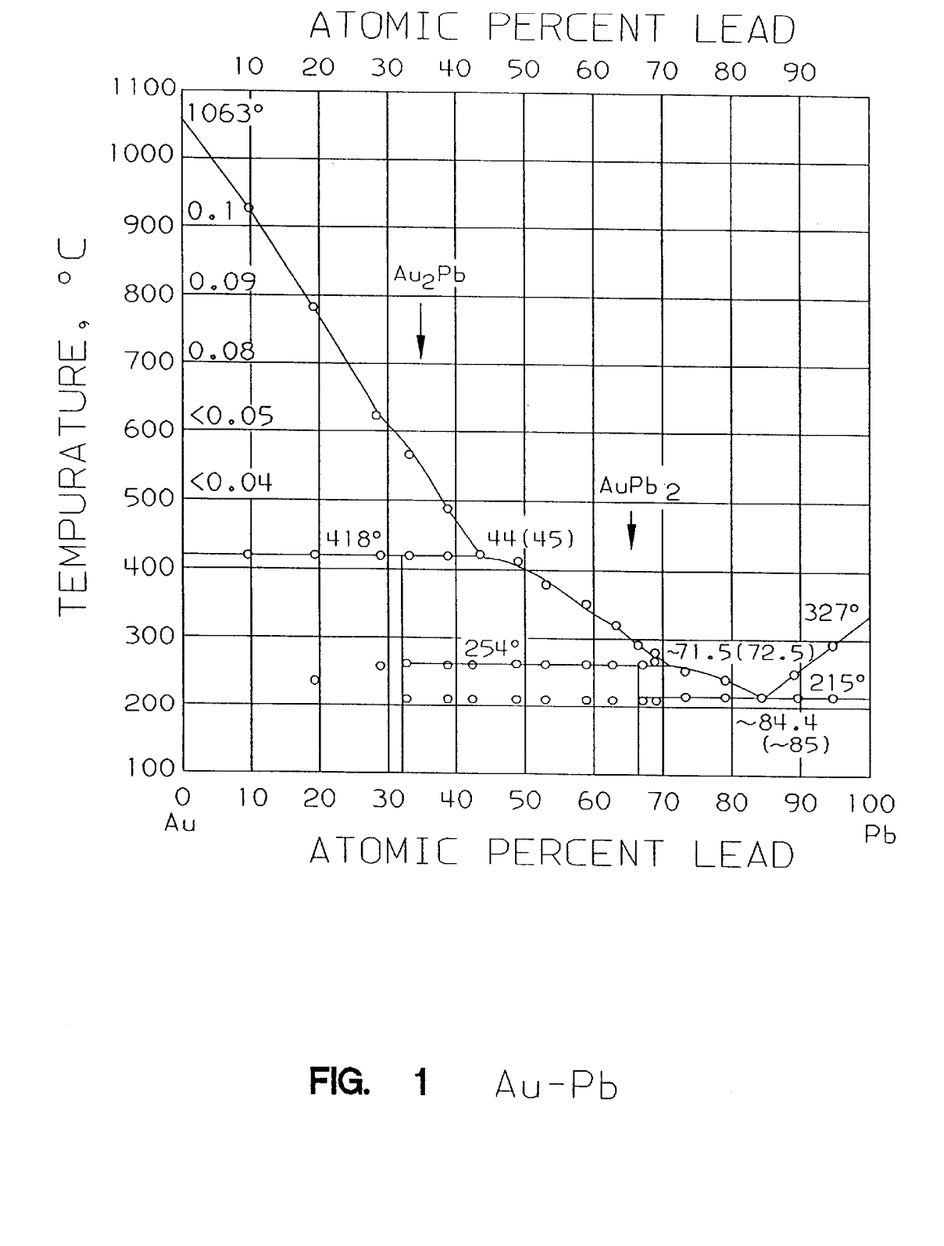
FIG. 1 displays the Au—Pb phase diagram.

Significantly, the way in which the first and second components are chosen in relation to each other is by reference to phase diagrams, which are readily found in standard references. Included among these are the following three reference books, which are hereby incorporated by reference: (1) Hansen and Anderko, Constitution of Binary Alloys (McGraw-Hill, 1985); (2) Elliot, Constitution Of Binary Alloys, First Supplement (McGraw-Hill, 1985); and (3) Shunk, Constitution Of Binary Alloys, Second Supplement (McGraw-Hill, 1985). Thus, for example, as depicted in FIG. 1, which is the phase diagram for Au—Pb, as found on page 223 of reference (1), above, there exists a eutectic composition for this alloy system at about 84.4 atomic percent Pb and about 15.6 atomic percent Au, having a corresponding eutectic (i.e., melting) temperature of about 215 degrees C. Moreover, as is immediately obvious from this phase diagram, the melting temperature of Pb is 327 degrees C, while the melting temperature of Au is 1063 degrees C. Therefore, if each solder ball had a composition which included only Pb and the upper portion of each contact pad had a composition which included only Au, and if the solder balls and contact pads were brought into contact with each other, subjected to sufficient pressure to break any oxide layers on the solder balls and/or contact pads and heated to 215 degrees C, then a eutectic liquid melt, having a composition which included about 84.4 atomic percent Pb and about 15.6 atomic percent Au, would form at the interface between each solder ball and the corresponding contact pad. On cooling and solidification, the interfacial eutectic composition would form an effective mechanical and electrical bond between the solder ball and the contact pad, provided the corresponding chip package was not subjected to temperatures equal to or greater than 215 degrees C. (However, as noted above, such a bond would tend to dissociate very slowly at room temperature, over a period of months or years.)

During the above-described eutectic reaction between Pb and Au, the Pb solder ball would serve as the source of Pb, but the bulk of the solder ball would undergo no melting. In addition, the upper portion of the contact pad would serve as the source of Au, but the underlying bulk of the contact pad would not participate in the eutectic reaction and would not melt at the eutectic temperature.

Figure 2:
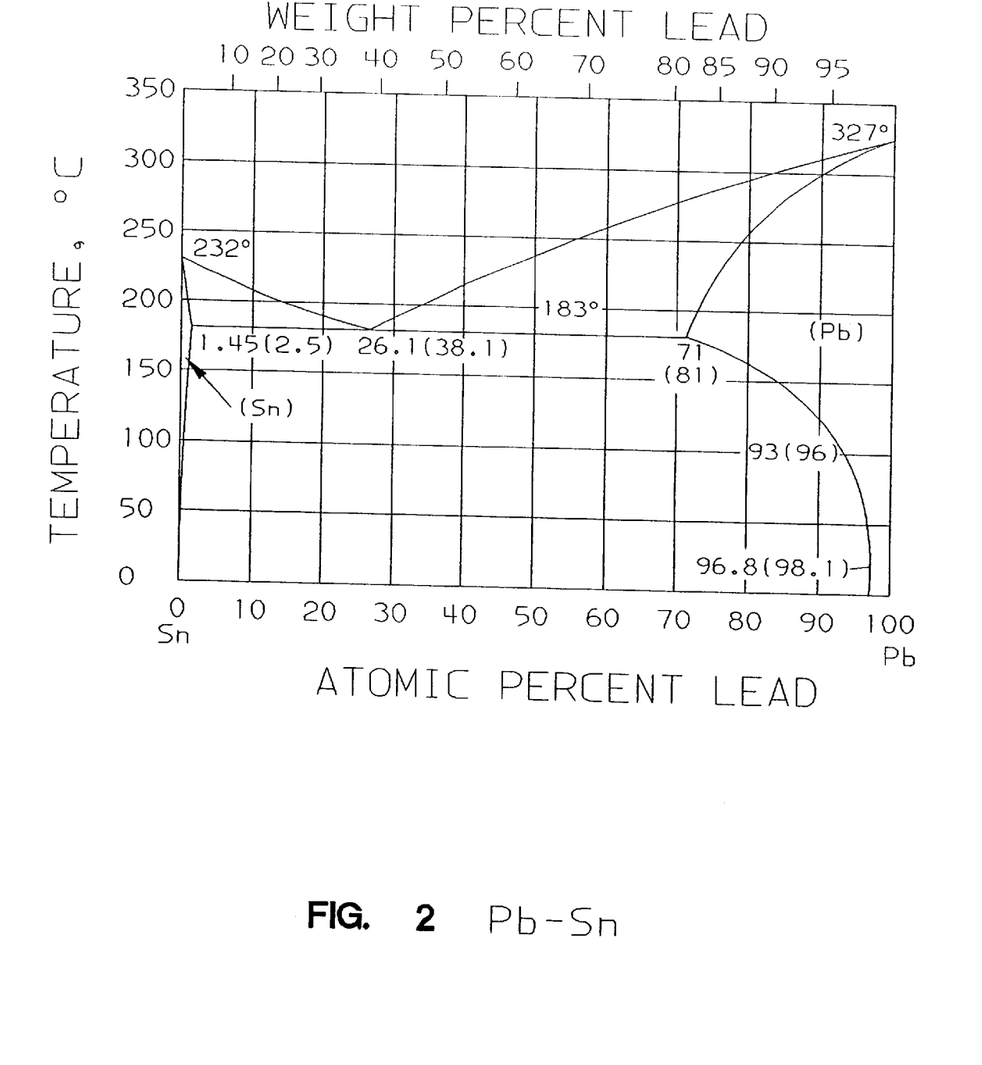
FIG. 2 displays the Pb—Sn phase diagram.

By analyzing the phase diagrams contained in the above-listed references, one can readily find a variety of solder ball compositions, e.g., binary solder ball compositions, and contact pad compositions which react to form the interfacial RLMPCs associated with the inventive method. For example, a perusal of the Pb—Sn phase diagram, as found on page 1107 of reference (1), above, which is reproduced in FIG. 2, indicates that for this alloy system, if the amount of Pb is equal to or greater than 90 atomic percent and the amount of Sn is equal to or less than 10 atomic percent, then the corresponding alloy melting temperatures are equal to or greater than 300 degrees C. Based upon the Au—Pb phase diagram, discussed above, it follows that by using a solder ball having a binary composition which includes at least 90 atomic percent Pb and no more than 10 atomic percent Sn, and using a contact pad having an upper portion made of Au, that such a solder ball and such a contact pad will produce a Au—Pb interfacial eutectic composition upon heating at 215 degrees C, without melting the bulk of the solder ball.

Additional useful combinations of solder ball compositions and contact pad compositions are readily found by perusing phase diagrams. For example, a perusal of the Pb—In phase diagram, as found on page 855 of reference (1), above, indicates that this alloy system includes an alpha phase in which the amount of Pb is equal to or greater than 55 atomic percent and the amount of In is equal to or less than 45 atomic percent, and the corresponding melting temperature is equal to or greater than 235 degrees C. In addition, a perusal of the Au—In phase diagram, as found on page 211 of reference (1), above, reveals that Au and In form a relatively low melting point composition at 154 degrees C. Therefore, by using a solder ball having a binary composition which includes at least 55 atomic percent Pb and no more than 45 atomic percent In, and using a contact pad having an upper portion made of Au, it follows that such a solder ball and such a contact pad will produce a Au—In interfacial RLMPC upon heating at 154 degrees C, without melting the bulk of the solder ball.

By employing the type of analysis described above, and by perusing the Ag—In phase diagram found on page 27 of reference (1), above, it can readily be shown that using a solder ball having a binary composition which includes at least 55 atomic percent Pb and no more than 45 atomic percent In, in combination with a contact pad having an upper portion made of Ag, that heating at 141 degrees C results in a Ag—In interfacial RLMPC, with no melting of the bulk of the solder ball. Moreover, by using the same solder ball in combination with a contact pad having an upper portion made of Au, it can readily be shown (with reference to the Au—Pb phase diagram) that heating at 215 degrees C results in a Au—Pb interfacial eutectic composition, with no melting of the bulk of the solder ball.

Further perusals of other phase diagrams readily yield additional useful solder ball and contact pad compositions. For example, a perusal of the Sn—In phase diagram, found on page 861 of reference (1), above, indicates that this alloy system includes a phase in which the amount of Sn is equal to or greater than 90 atomic percent and the amount of In is equal to or less than 10 atomic percent, and the corresponding melting temperature is equal to or greater than 200 degrees C. As noted above, the Au—In phase diagram exhibits an RLMPC at 154 degrees C, while the Ag—In phase diagram exhibits an RLMPC at 141 degrees C. Therefore, by using a solder ball having a composition which includes at least 90 atomic percent Sn and no more than 10 atomic percent In, in combination with a contact pad having an upper portion made of either Au or Ag, heating at 154 degrees C yields a Au—In RLMPC (if the upper portion of the contact pad is made of Au), while heating at 141 degrees C yields a Ag—In RLMPC (if the upper portion of the contact pad is made of Ag), without melting the bulk of the solder ball.

A still further perusal of, for example, the Sn—Sb phase diagram, found on page 1175 of reference (1), above, reveals that this alloy system includes an alpha phase in which the amount of Sn is equal to or greater than 89.7 atomic percent and the amount of Sb is equal to or less than 10.3 atomic percent., and the corresponding melting temperature is equal to or greater than 246 degrees C. A perusal of the Au-Sn phase diagram, found on page 233 of reference (1), above, reveals the existence of multiple compositions, i.e., a eutectic composition and pro-eutectic compositions, at temperatures of 217 degrees C and higher. In addition, a perusal of the Ag-Sn phase diagram, found on page 52 of reference (1), above, reveals the existence of a eutectic at 221 degrees C. Therefore, by using a solder ball having a composition which includes at least 89.7 atomic percent Sn and no more than 10.3 atomic percent Sb in combination with a contact pad having an upper portion made of either Au or Ag, heating at 217 degrees or higher yields Au—Sn interfacial multi-compositional RLMPCs (if the upper portion of the contact pad is made of Au), while heating at 221 degrees C yields a Ag—Sn interfacial eutectic composition (if the upper portion of the contact pad Is made of Ag), without melting the bulk of the solder ball.

As noted above, each solder ball and contact pad must be subjected to sufficient pressure to break any oxide layers which may have formed on the surface of the solder ball or contact pad. In general, the amount of pressure varies depending on the compositions of the solder ball and contact pad, as well as the size of the solder ball. Therefore, in general, the appropriate amount of pressure must be determined empirically. This is readily achieved by mounting control samples of the semiconductor chip of interest, using the solder balls of interest, onto the contact pads of control samples of the organic chip carrier of interest. Then, increasing amounts of pressure are to be applied to successive control samples, while heating these control samples at the temperature needed to form the desired interfacial, relatively low melting point composition. The pressure needed to break the oxide layers is that pressure at which the interfacial melt composition first forms, which is readily detected by taking cross-sections of the solder balls used with the control samples and examining these cross-sectional samples using conventional techniques to detect the presence of the interfacial melt composition. For example, such detection is readily accomplished using conventional scanning electron microscopy techniques, in combination with conventional wavelength dispersive spectroscopy techniques or conventional energy dispersive spectroscopy techniques.

The strength of the mechanical and electrical connection between a solder ball and its corresponding contact pad is proportional to the amount of the RLMPC composition formed at the interface between the solder ball and the contact pad. Because the volume of the solder ball is usually much larger than that of the upper portion of the contact pad, it follows that the volume of the upper portion of the contact pad determines the amount of the RLMPC, and therefore the strength of the connection. In general, the volume of the upper portion of the contact pad needed to achieve a desired strength is determined empirically. That is, this determination is achieved by employing control samples of the organic chip carrier of interest having contact pads with upper portions of varying volume, mounting control samples of the semiconductor chip of interest on the control samples of the organic chip carrier, via solder balls of interest, and then reacting all of the upper portions with the solder balls. (One can readily determine whether all of the upper portions have reacted with the solder balls by taking cross-sections of the contact pads and solder balls and examining the cross-sectional samples using conventional scanning electron microscopy techniques.) By applying conventional pull tests (tests in which the semiconductor chip is pulled away from the corresponding organic chip carrier substrate, or vice versa) to the control samples of the organic chip carrier, one can readily determine which control sample exhibits the desired strength.

If a chip package, fabricated in accordance with the above-described inventive method, must be subjected to further processing, or must operate, at temperatures which equal or exceed the melting temperature of the RLMPC (or RLMPCs) formed at the interfaces between the solder balls and contact pads, then the strength of the mechanical and electrical connections between these solder balls and contact pads will obviously be compromised. To avoid such compromise, and in accordance with the invention, a chip package which has been processed as described above, is subjected to further heating, either after solidification of the interfacial RLMPC, or while this composition is still liquid. To avoid melting either the solder balls or the contact pads, this further heating occurs at a temperature or temperatures below the melting temperatures of the solder balls and of the contact pads. Preferably, this heating occurs at a temperature which is below the melting temperature of the RLMPC. The purpose of this heating is to completely dissociate the interfacial RLMPC and to disperse the second component of the interfacial RLMPC into and within each solder ball via solid state diffusion. As a consequence, the concentration of the second component within the solder ball will be non-uniform. Significantly, the dissociation of the interfacial RLMPC implies that this composition is no longer present, and therefore cannot melt, if the chip package is subjected to temperatures which equal or exceed the melting temperature of the RLMPC. Moreover, because the solder balls are usually much larger than the upper portions of the contact pads, the amount of material diffused into each solder ball is usually very small in comparison with the volume of the solder ball. Therefore, the composition of the solder ball is only slightly altered during this process, and therefore the melting temperature of the solder ball is only slightly altered. Because the melting temperature of the solder ball invariably remains much higher than the melting temperature of the interfacial RLMPC, it follows that the solder ball will not melt when the chip package is exposed to temperatures which exceed the melting temperature of the interfacial RLMPC.

To provide concrete examples of the above-described additional processing, if the composition of each solder ball includes only Pb and the upper portion of each contact pad is made of Au, then, as described above, the interfacial RLMPC will be a Au—Pb eutectic composition. Therefore, the purpose of the additional heating would be to dissociate the Au—Pb eutectic composition and to disperse the Au (the second) component of the eutectic composition into and within the solder ball via solid state diffusion. Similarly, if the composition of each solder ball includes, for example, Pb and In, and the upper portion of each contact pad is made of, for example, Ag, then, as described above, the interfacial RLMPC will be a Ag—In eutectic composition. Therefore, the purpose of the additional heating would be to dissociate the Ag—In eutectic composition and to disperse the Ag (the second) component of the eutectic composition into and within the solder ball via solid state diffusion.

In general, the higher the temperature used, the shorter is the amount of time needed to completely dissociate an interfacial composition and to disperse the second component of the interfacial composition into and within a solder ball. For a given heating temperature, the amount of time needed to completely dissociate and to disperse is readily determined empirically by heating control samples of the chip package of interest at this given temperature for successively increasing times, cross-sectioning the solder ball regions of these control samples and using conventional scanning electron microscopy techniques in combination with, for example, conventional wavelength dispersive techniques, to detect the presence or absence of the interfacial composition.

It should be noted that when the second component of an interfacial RLMPC diffuses into a solder ball, it may chemically combine with a compositional component of the solder ball. For example, when Au diffuses into a solder ball having a composition which includes Pb and Sn, the Au combines with the Sn to form a Au—Sn compound, i.e., $AuSn_2$.

Significantly, when the second component of an interfacial RLMPC is dispersed via solid state diffusion into and within a solder ball, the resulting solder ball is readily distinguished from solder balls which have not been subjected to such solid state diffusion, including solder balls into which the second component has been dispersed via liquid diffusion. This distinction is readily shown by vertically cross-sectioning a solder ball at its largest diameter and imposing an imaginary 10×10 grid of equally dimensioned rectangles on the exposed surface area of the cross-sectioned solder ball, all of which rectangles must fall within, and cover at least 90 percent of, the exposed surface area. If one then measures the concentration of the second component (in elemental or compound form) at the center of each rectangle, then a solder ball which has been subjected to solid state diffusion will satisfy the following criterion:

$$((C_h - C_1)/C(avg)) \times 100 \geq 30\%.$$

Here, $C_h$ denotes the highest measured concentration, $C_1$ denotes the lowest measured concentration and C(avg) denotes the average measured concentration. It must be emphasized that a solder ball which has been subjected to liquid diffusion will not satisfy this criterion.

Parenthetically, it should be noted that the concentrations associated with the above-described criterion are readily measured using conventional scanning electron microscopy techniques, in combination with conventional wavelength dispersive spectroscopy techniques or energy dispersive spectroscopy techniques.

As a pedagogical aid to a more complete understanding of the invention, a description of the preferred embodiment of the inventive method, and of the resulting chip package, is given below.

The preferred embodiment of the inventive method is depicted in FIGS. 3(a)–(d). In this preferred embodiment, the solder balls 30 mounted on the contact pads 20 of a semiconductor chip 10 have a composition which includes at least 94 percent (by weight) Pb and no more than 6 percent (by weight) Sn, with the preferred composition being 97 percent (by weight) Pb and 3 percent (by weight) Sn. In addition, the largest diameters of the solder balls are, for example, 0.004 inches or 0.005 inches. Moreover, the height of each of the solder balls (which are obviously truncated spheres) ranges from about 50 percent to about 90 percent of the largest diameter of the solder ball.

In the preferred embodiment, the semiconductor chip 10 is to be mounted, via the solder balls 30, onto the contact pads 50 on a polyimide chip carrier substrate 40. Each such contact pad is either circular in shape, with a corresponding diameter of 0.005 inches, or oval in shape, with corresponding large and small diameters of, respectively, 0.006 inches and 0.004 inches.

Figure 3:
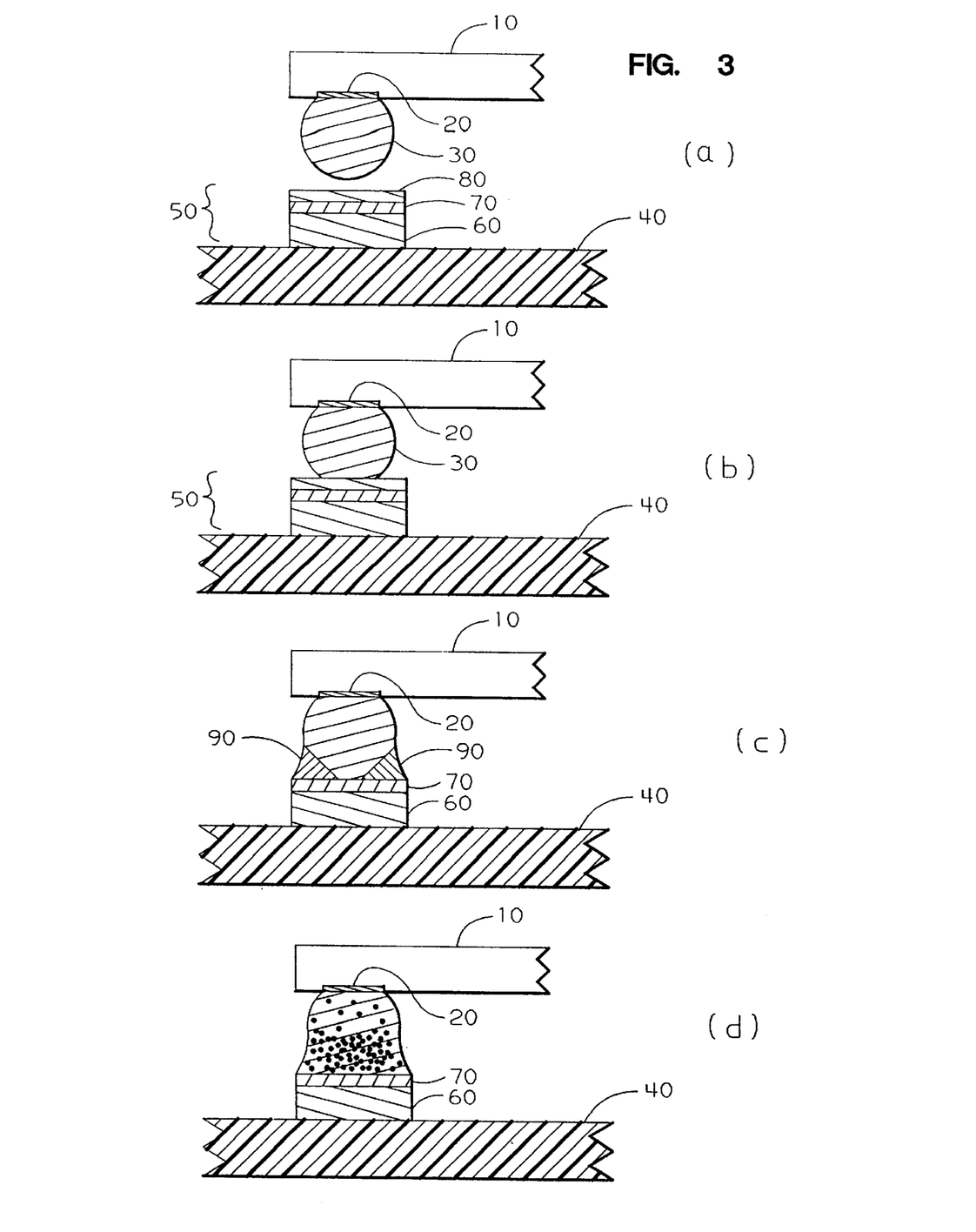
FIGS. 3(a)–3(d) depict the steps involved in a preferred embodiment of the inventive method.

Significantly, as shown in FIG. 3, each contact pad 50 includes a layer 60 of Cu (having a melting temperature of 1083 degrees C), a layer 70 of Ni (having a melting temperature of 1453 degrees C) and a layer 80 of Au. Significantly, the layer 60 of Cu is not involved in the eutectic reaction, described below. In addition, the layer 70 of Ni serves as a diffusion barrier, preventing Cu from diffusing upwardly and reacting with the Au, which would otherwise undesirably reduce the amount of Au available for the eutectic reaction. In addition, the layer 70 prevents $AuSn_2$ (the formation of which is described below) from diffusing downwardly, to the solder ball/contact pad interface, which would result in a weak and brittle solder ball/contact pad bond.

The thickness of the layer 60 of Cu ranges from about 0.0005 inches to about 0.0025 inches, and is preferably 0.0014 inches. Thicknesses less than about 0.0005 inches are undesirable because they are mechanically unsound. On the other hand, thicknesses greater than about 0.0025 inches are undesirable because they are unnecessary and do not improve the performance of the contact pad 50.

The thickness of the layer 70 of Ni ranges from about 0.000015 inches to about 0.000035 inches, and is preferably about 0.000025 inches. Thicknesses less than about 0.000015 inches are undesirable because they imply a relatively high probability of voids in the layer 70, which undermine the barrier function of the layer 70. On the other hand, thicknesses greater than about 0.000035 inches are unnecessary and do not improve the barrier properties of the layer 70.

The thickness of the layer 80 of Au ranges from about 0.000015 inches to about 0.000035 inches. Thicknesses less than about 0.000015 inches are undesirable because they again imply a relatively high probability of undesirable voids in the layer 80. On the other hand, thicknesses greater than about 0.000035 inches result in the formation of an undesirably large amount of interfacial Au—Pb eutectic composition, discussed below, which is difficult to dissociate within convenient periods of time. Moreover, such a large amount of eutectic composition includes so much Au that all of the Au cannot be diffused into the solder ball.

Figure 4:
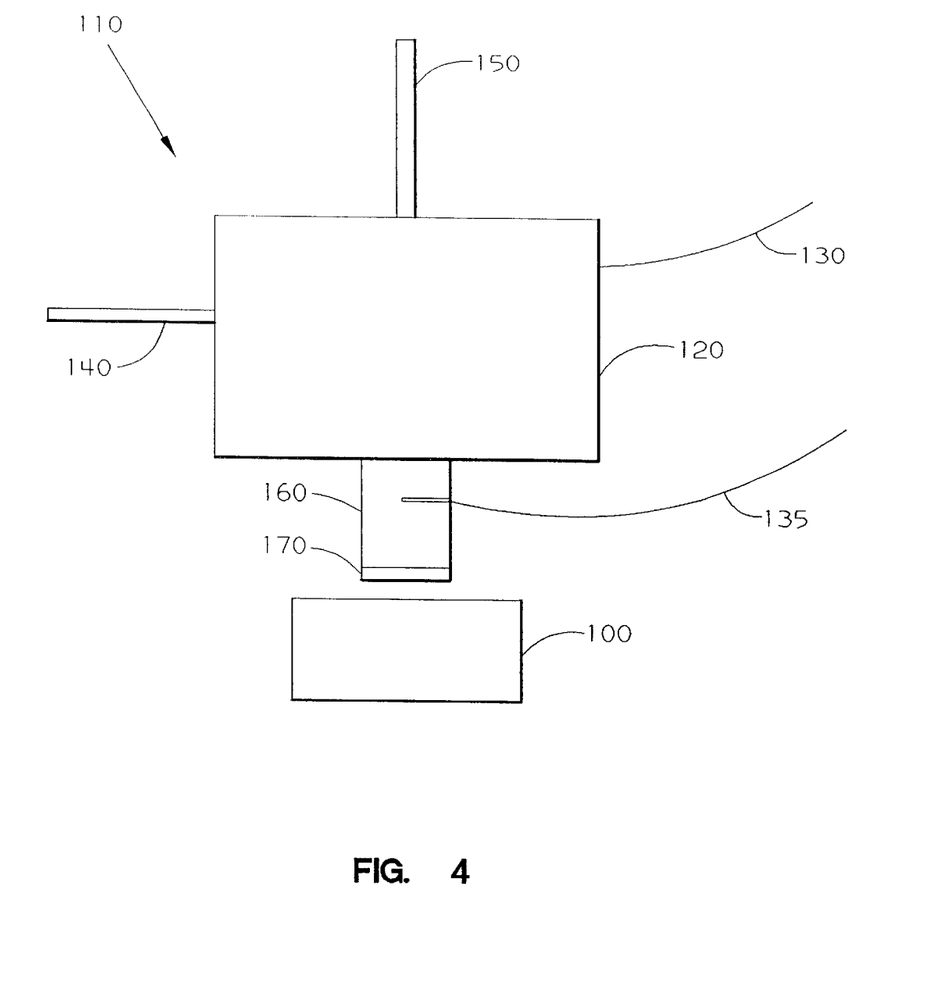
FIG. 4 is a front view of a hot air thermode used in conjunction with the inventive method.

In the course of mounting the semiconductor chip 10 onto the polyimide chip carrier substrate 40, in accordance with the preferred embodiment of the inventive method, the chip 10 is initially placed face-up on a pre-heat stage 100, depicted in FIG. 4. This pre-heat stage, which includes a resistance heater (not shown), is used to pre-heat the chip 10, and therefore the solder balls 30, to a temperature of 200 degrees C for 5 to 10 seconds. Then, the polyimide chip carrier substrate 40 is placed face-down over the chip 10, and the contact pads 50 brought into contact with the solder balls 30, as depicted in FIG. 3(b).

Significantly, FIG. 4 depicts a hot air thermode 110 which is used in the preferred embodiment of the inventive method to apply pressure to the solder balls 30 and contact pads 50, to break any oxide layers covering the solder balls or contact pads. In addition, the hot air thermode is used to heat the solder balls and contact pads to a temperature greater than 215 degrees, in order to form the Au—Pb eutectic composition, discussed above, at the interfaces between the solder balls and the contact pads. As shown in FIG. 4, the hot air thermode 110 includes a heat exchanger 120, which includes a resistance heater (not shown). Electrical power is communicated to the resistance heater via an electrical conductor 130. The hot air thermode 110 also includes a tube 140, through which nitrogen gas is flowed into the heat exchanger 120. In addition, the thermode 110 includes a tube 150, through which room temperature nitrogen gas is flowed into the heat exchanger 120. Moreover, the thermode 110 includes a nozzle 160, from which nitrogen gas entering the heat exchanger exits. A temperature sensor 135 is positioned within the nozzle 160. The end of the nozzle 160 includes a layer 170 of sintered, porous metal, which is permeable to the nitrogen gas.

After the polyimide chip carrier substrate 40 is placed over the chip 10 and the contact pads 50 brought into contact with the solder balls 30, the layer 170 of sintered, porous metal of the nozzle 160 of the hot air thermode 110 is placed against the back of the chip 10 and sufficient force is applied so as to subject each of the solder balls to a force of 8 grams per chip. This is done for a period of about 0.5 to about 1.0 seconds, which is sufficient to break any oxide layers on the surfaces of the solder balls and/or contact pads. Then, nitrogen gas is flowed through the tube 140 and into the heat exchanger 120, while electrical power is supplied to the resistance heater in the heat exchanger. As a consequence, the nitrogen gas is heated and, upon flowing through the nozzle 160, serves to heat the solder balls 30 and contact pads 50 to above 215 degrees C. This heating is continued for about 0.3 to about 1.0 seconds, thereby producing the above-described Au—Pb liquid eutectic composition at the interfaces between the solder balls and the contact pads. Interestingly, this liquid composition tends to get pushed to the sides of each solder ball 30 by the thermode 110. After this heating is completed, room temperature nitrogen gas is flowed through tube 150 and out of nozzle 160 for a period of about 1.0 to about 3.0 seconds, in order to cool the Au—Pb liquid composition, and thereby form the solid electrical/mechanical connection 90 depicted in FIG. 3(c) between each solder ball 30 and the corresponding contact pad 50.

After the formation of the electrical/mechanical connections 90 between the solder balls 30 and contact pads 50, the resulting chip package is removed from the pre-heat stage 100 and the solder balls and electrical/mechanical connections 90 are preferably encapsulated in an epoxy encapsulant. During this encapsulation process, the chip package is baked at 165 degrees C for about 3 hours, in order to cure the epoxy. Significantly, this baking process also serves to dissociate all of the solid Au—Pb connections 90 and to disperse the Au into and within the solder balls via solid state diffusion, where the Au chemically combines with Sn to form $AuSn_2$. The results of this dispersion process are depicted in FIG. 3(d), which shows $AuSn_2$ non-uniformly dispersed in a solder ball 30.

While the invention has been particularly shown and described with reference to preferred embodiments thereof, it will be understood by those skilled in the art that various changes in form and details may be made therein without departing from the spirit and scope of the invention.

What is claimed is:

1. A semiconductor chip package, comprising:

a semiconductor integrated circuit chip which includes at least one chip contact pad;

an organic chip carrier substrate which includes at least one carrier contact pad including a first layer of copper and a second layer of a different metal thereon, the region of said organic chip carrier adjacent said carrier contact being essentially free of solder mask material;

a region of solder electrically and mechanically connecting said at least one chip contact pad to said at least one carrier contact pad, said region of solder including a first component of Pb, a second component of Sn and a third component of Au combined by solid state diffusion with said second component of Sn such that said resulting combination of said second and third components is non-uniformly dispersed within said region of solder, said second layer of metal of said at least one carrier contact pad preventing said first layer of copper of said at least one carrier contact pad from diffusing into said region of solder.

2. The semiconductor chip package of claim 1 wherein said organic chip carrier substrate is comprised of polyamide.

3. The semiconductor chip package of claim 1 wherein said second layer of metal of said carrier contact pad is comprised of nickel.

4. The semiconductor chip package of claim 1 wherein said second layer of metal of said carrier contact pad further prevents said combined components of Sn and Au from diffusing into said copper.

5. A semiconductor chip package comprising:

a semiconductor integrated circuit chip which includes at least one chip contact pad;

an organic chip carrier substrate which includes at least one carrier contact pad including a first layer of copper and a second layer of a different metal thereon, the region of said organic chip carrier adjacent said carrier contact being essentially free of solder mask material;

a region of solder electrically and mechanically connecting said at least one chip contact pad to said at least one carrier contact pad, said region of solder including a first component of Pb, a second component of In, and a third component of Au combined by solder state diffusion with said second component of In such that said resulting combination of said second and third components is non-uniformly dispersed within said region of solder, said second layer of metal of said at least one carrier contact pad preventing said first layer of copper of said at least one carrier contact pad from diffusing into said region of solder.

6. The semiconductor chip package of claim 5 wherein said organic chip carrier substrate is comprised of polyimide.

7. The semiconductor chip package of claim 5 wherein said second layer of metal of said carrier contact pad is comprised of nickel.

8. The semiconductor chip package of claim 5 wherein said second layer of metal of said carrier contact pad further prevents said combined components of In and Au from diffusing into said copper.

* * * * *